United States Patent
Chilcott

(10) Patent No.: US 7,534,641 B2
(45) Date of Patent: May 19, 2009

(54) METHOD FOR MANUFACTURING A MICRO-ELECTRO-MECHANICAL DEVICE

(75) Inventor: Dan W. Chilcott, Greentown, IN (US)

(73) Assignee: Delphi Technologies, Inc., Troy, MI (US)

(*) Notice: Subject to any disclaimer, the term of this patent is extended or adjusted under 35 U.S.C. 154(b) by 175 days.

(21) Appl. No.: 11/238,855

(22) Filed: Sep. 29, 2005

(65) Prior Publication Data

US 2007/0072331 A1    Mar. 29, 2007

(51) Int. Cl.
*H01L 21/00* (2006.01)
(52) U.S. Cl. .................. 438/53; 438/456; 438/459; 257/E21.532; 257/E21.573
(58) Field of Classification Search ........... 438/456, 438/459, 455, 50, 52–53, 118; 257/E21.532, 257/E21.533, E21.567, E21.573
See application file for complete search history.

(56) References Cited

U.S. PATENT DOCUMENTS

| | | | |
|---|---|---|---|
| 5,706,565 A | 1/1998 | Sparks et al. | |
| 5,760,455 A * | 6/1998 | Hierold et al. | 257/415 |
| 5,831,162 A | 11/1998 | Sparks et al. | |
| 6,180,428 B1 * | 1/2001 | Peeters et al. | 438/22 |
| 6,191,007 B1 * | 2/2001 | Matsui et al. | 438/459 |
| 6,495,388 B1 * | 12/2002 | Ismail | 438/53 |
| 2002/0132490 A1 * | 9/2002 | Sheng | 438/733 |
| 2003/0073261 A1 * | 4/2003 | Olav et al. | 438/67 |

FOREIGN PATENT DOCUMENTS

| | | |
|---|---|---|
| DE | 101 43 968 | 4/2002 |
| EP | 1 398 298 | 3/2004 |

OTHER PUBLICATIONS

"Advanced Plasma Processing Combined with Trench Isolation Technology for Fabrication and Fast Prototyping of High Aspect Ratio MEMS in Standard Silicon Wafers," E. Sarajlić, M.J. de Boer, H. V. Jansen, N. Arnal, M. Puech, G. Krijnen and M. Elwenspoek, *Journal of Micromechanics and Microengineering*, Aug. 20, 2004, pp. S70-S75.

"A Threshold Pressure Switch Utilizing Plastically-Deformed Silicon," Huff, M.A., A.D. Nikolich, and M.A. Schmidt, Microsystems Technology Laboratories, Massachusetts Institute of Technology, Cambridge, MA Jun. 1991, (pp. 177-180).

"Application of the Footing Effect in the Micromachining of Self-Aligned, Free-Standing, complimentary Metal-Oxide-Semiconductor Compatible Structures," A. A. Ayón, K. Ishihara, R. A. Braff, H. H. Sawin and M. A. Schmidt, *J. Vac. Sci. Technol. A*, vol. 17, No. 4, Jul./Aug. 1999, 6 pages.

* cited by examiner

*Primary Examiner*—Thanhha Pham
(74) *Attorney, Agent, or Firm*—Jimmy L. Funke

(57) ABSTRACT

A technique for manufacturing a micro-electro-mechanical (MEM) device includes a number of steps. Initially, a first wafer is provided. Next, a bonding layer is formed on a first surface of the first wafer. Then, a portion of the bonding layer is removed to provide a cavity including a plurality of spaced support pedestals within the cavity. Next, a second wafer is bonded to at least a portion of the bonding layer. A portion of the second wafer provides a diaphragm over the cavity and the support pedestals support the diaphragm during processing. The second wafer is then etched to release the diaphragm from the support pedestals.

17 Claims, 3 Drawing Sheets

US 7,534,641 B2

METHOD FOR MANUFACTURING A MICRO-ELECTRO-MECHANICAL DEVICE

TECHNICAL FIELD

The present invention is generally directed to a micro-electro-mechanical (MEM) device and, more specifically, to a technique for manufacturing a MEM device.

BACKGROUND OF THE INVENTION

Various techniques exist for manufacturing micro-electro-mechanical (MEM) devices, also known as micro-electro-mechanical systems (MEMS) devices. In a typical process, single crystal silicon MEM devices are created using bulk etching, silicon-on-insulator (SOI) wafers or buried cavity techniques. One technique has formed a MEM device, having a buried cavity, by etching a cavity in a handle wafer and then bonding an active wafer to the handle wafer. In a usual case, the active wafer is then thinned to form a single crystal silicon diaphragm (membrane) that is suspended above the cavity. It is generally desirable to manufacture MEM devices with a buried cavity process as the size of such devices are reduced (which lowers cost), as compared to devices made through bulk etch techniques which rely on a tapered etch from the back of the handle wafer to form the diaphragm. Furthermore, MEM devices incorporating buried cavities and including moving structures that are formed with a dry deep reactive ion etch (DRIE) process do not exhibit process induced stiction problems. For example, U.S. Pat. Nos. 5,706,565 and 5,831,162, each of which are hereby incorporated herein by reference in their entirety, describe sensors made by buried cavity techniques.

However, MEM devices made by buried cavity techniques are, in general, temperature limited as the diaphragm may plastically deform during processing if a process temperature is too high. In general, the temperature at which a diaphragm deforms is low enough that the buried cavity technique is incompatible with most complementary metal-oxide semi-conductor (CMOS) processes.

Plastic deformation of silicon occurs when the stress in the silicon exceeds the flow stress of the silicon. In general, this occurs in buried cavity MEM processes when thin diaphragms are created and stress, induced by differential pressure across the cavity or by thin films, exceeds the flow stress limit, which is a function of temperature for silicon. While this phenomena has been utilized by designers to purposely plastically deform membranes of MEM devices that function as switches, plastic deformation is undesirable in other applications. Typically, for most applications, the membrane thickness and cavity size for a buried cavity MEM device is such that the membrane generally cannot tolerate temperatures above 800° C. without experiencing plastic deformation.

What is needed is a technique for creating a MEM device, with a buried cavity, that is compatible with most complementary metal-oxide semiconductor (CMOS) processes.

SUMMARY OF THE INVENTION

One embodiment of the present invention is directed to a technique for manufacturing a micro-electro-mechanical (MEM) device that includes a number of steps. Initially a first wafer is provided. Next, a portion of the first wafer is removed to provide a cavity including a plurality of spaced support pedestals within the cavity. Then, at least a portion of a second wafer is bonded to the first wafer. A portion of the second wafer provides a diaphragm over the cavity and the support pedestals support the diaphragm during processing. According to another aspect, the second wafer is etched to release the diaphragm from the support pedestals. The first wafer may be a handle wafer and the second wafer may be an active wafer, or vice versa. The handle and active wafers may also be silicon wafers. According to a different aspect, the pedestals are not bonded to the diaphragm.

According to another embodiment of the present invention, a process for manufacturing a MEM device includes providing a handle wafer. Next, a bonding layer is formed on a first surface of the handle wafer. Then, a portion of the bonding layer is removed to provide a cavity including a plurality of spaced support pedestals within the cavity. Next, an active wafer is bonded to at least a portion of the bonding layer. A portion of the active wafer provides a diaphragm over the cavity and support pedestals support the diaphragm during processing. The active wafer may then be etched to release the diaphragm from the support pedestals, if the pedestals are bonded to the diaphragm. This etch step may also release at least a portion of the diaphragm adjacent a sidewall of the cavity to provide a movable diaphragm.

According to a different aspect of the present invention, the handle and active wafers are silicon wafers. According to another aspect of the present invention, the bonding layer is made of silicon, an oxide or a nitride. According to another embodiment of the present invention, the support pedestals support the diaphragm during processing to prevent plastic deformation of the diaphragm. According to yet another embodiment of the present invention, the active wafer is thinned to provide a desired thickness for the diaphragm. According to yet another aspect of the present invention, the step of etching the active wafer to release the diaphragm from the support pedestals further comprises the step of etching at least a portion of the diaphragm adjacent a sidewall of the cavity to allow the diaphragm to move.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

A technique is disclosed herein that provides a micro-electro-mechanical (MEM) device whose moveable structure (i.e., diaphragm or membrane) is supported during processing to eliminate temperature limitations. By introducing support pedestals within a cavity under the diaphragm, the stress in the silicon diaphragm is reduced. It should be appreciated that the distance between the pedestals determines the maximum stress that the silicon experiences at temperature. By creating a regular pattern of support pedestals, cavities of virtually any size can be created on a silicon wafer, without creating flow stress limit at temperature. In order to manufacture moving structures, according to this technique, an etch may be performed around the pedestals at the end of the process to free the structures or the pedestals may be recessed so that an etch is not required to free the structures.

According to the present invention, complementary metal-oxide semiconductor (CMOS) integration can be added to buried cavity MEM processes, without plastically deforming the silicon diaphragm. It should be appreciated that the use of regular pedestal spacing allows for the tailoring of the maximum stress and also allows for the formation of relatively large devices by replicating the pedestals in the cavity region. The pedestals can be made of any material compatible with the processes that the MEM devices undergo. For example, the bonding material may include silicon, oxides, nitrides and other semiconductor films.

Figure 1:
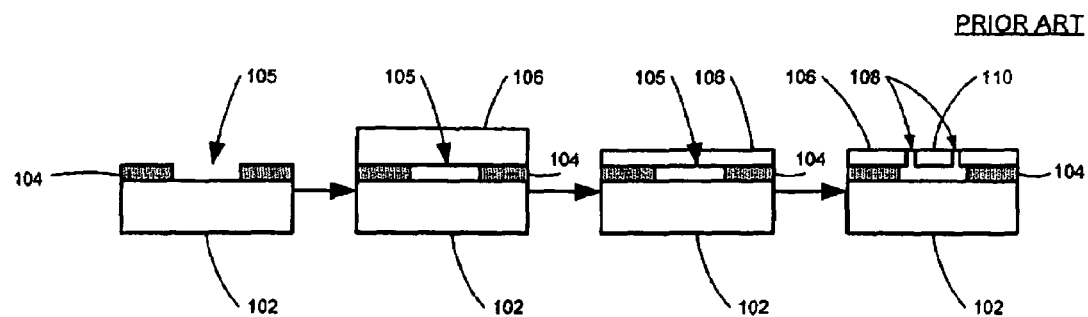
FIG. 1 is a cross-sectional view of various components of a micro-electro-mechanical (MEM) device created by a buried cavity process, according to the prior art.

With reference to FIG. 1, a relevant portion of a MEM device during various processing steps is depicted. As shown in FIG. 1, the buried cavity MEM process is initiated by forming a bonding layer 104 on a handle layer 102. Alternatively, the bonding layer may be dispensed with and two wafers may be directly bonded to each other. The bonding layer 104 is patterned and a cavity 105 is etched into the bonding layer 104. In the case where a bonding layer is not utilized, the cavity may be formed in either of the wafers. An active wafer 106 is then bonded to at least a portion of the bonding layer 104. Next, the active wafer 106 may be thinned to a desired diaphragm thickness, which is application dependent. A diaphragm 110 is then released through an etch process (e.g., a deep reactive ion etch (DRE) or other silicon etch technique), which forms trenches 108. The prior art process, which is described above, has temperature limits, above which plastic deformation of the diaphragm 110 can occur. As such, the MEM device of FIG. 1 is incompatible with most CMOS processes.

Figure 2:
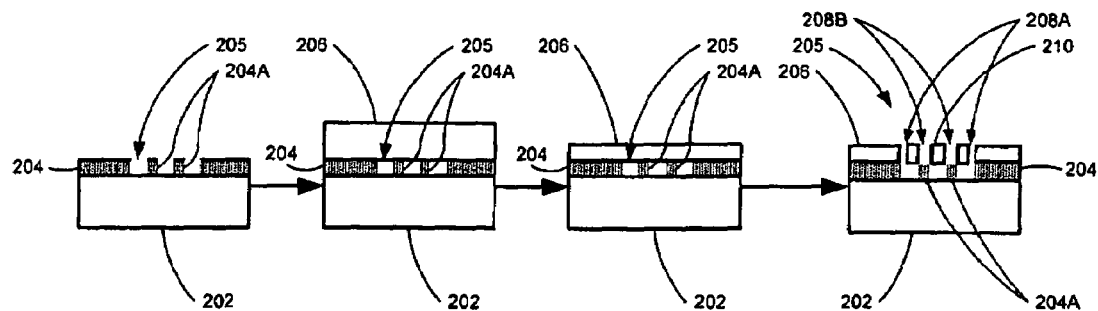
FIG. 2 is a cross-sectional view of various components of a MEM device during processing, according to one embodiment of the present invention.
Figure 2A:
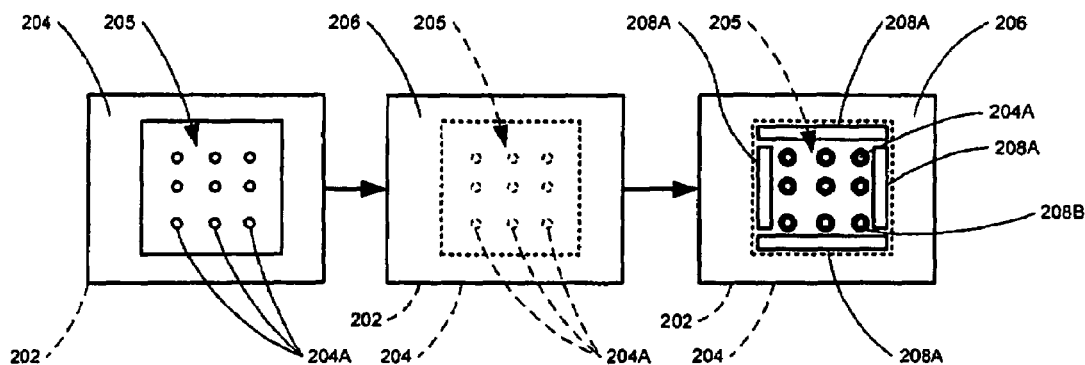
FIG. 2A is a top view of various components of another MEM device during processing, according to the present invention.

As is shown in FIG. 2, manufacturing of a MEM device, according to an embodiment of the present invention, is initiated by forming a bonding layer 204 on a handle wafer 202, which may be, for example, a silicon wafer. A cavity 205, including a plurality of spaced support pedestals 204A, is then formed in the bonding layer 204. Alternatively, as is discussed in further detail in conjunction with FIG. 4, two wafers may be directly bonded and a cavity and support pedestals may be formed in either of the two wafers. An active wafer 206 is then bonded to the bonding layer 204 to provide the buried cavity 205. Next, the active wafer 206 is thinned to a desired thickness. Alternatively, the active wafer 206 may be thinned prior to bonding to the bonding layer 204. Trenches 208A are then etched in the active wafer 206 along a sidewall of the cavity 205 to define and release at least a portion of a diaphragm 210 adjacent a sidewall of the cavity 205. In another step, or simultaneously with the previous step, holes 208B are etched in the active wafer 206 to release the diaphragm 210 from the support pedestals 204A, if the support pedestals 204A are not recessed. FIG. 2A depicts top views of another MEM device during various process handling steps.

Figure 3:
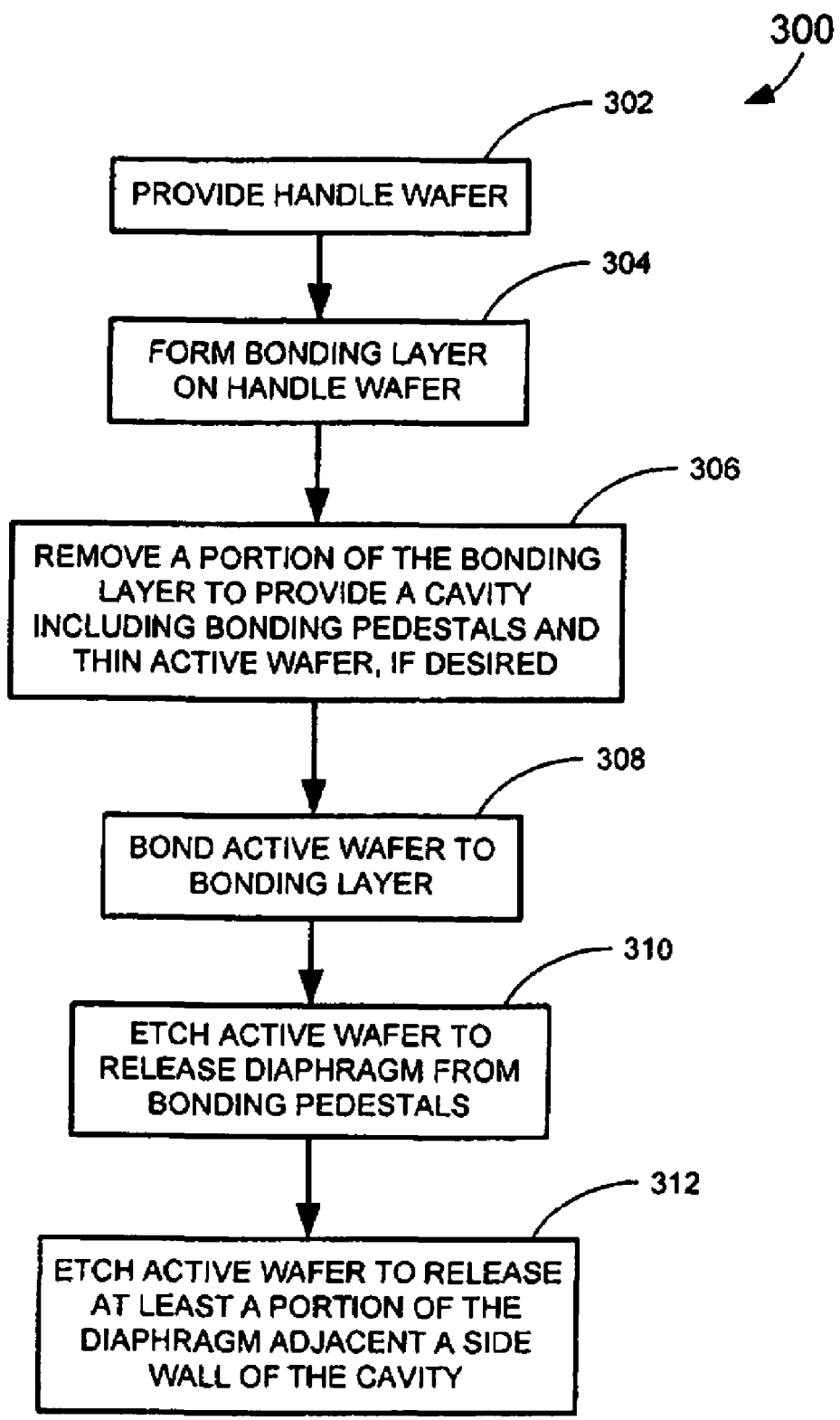
FIG. 3 is a flow chart of a process for manufacturing a MEM device, according to one embodiment of the present invention.

With reference to FIG. 3, a process 300 for manufacturing a MEM device is depicted. In step 302, a handle wafer, e.g., a silicon or glass wafer, is provided. Next, in step 304, a bonding layer is formed on the handle wafer. The bonding layer may be, for example, made of silicon, an oxide, a nitride or another film. Then, in step 306, a portion of the bonding layer is removed to provide a cavity including support pedestals. Next, in step 308, the active wafer is bonded to the bonding layer. Then, in step 310, assuming the support pedestals are not recessed, the active wafer is etched to release the diaphragm from the support pedestals. Finally, in step 312, if desired, the active wafer is etched to release at least a portion of the diaphragm adjacent a sidewall of the cavity. Alternatively, steps 310 and 312 may be performed in a single step. That is, the diaphragm may be released from the support pedestals and the trenches may be etched to release the diaphragm in a single step.

Figure 4:
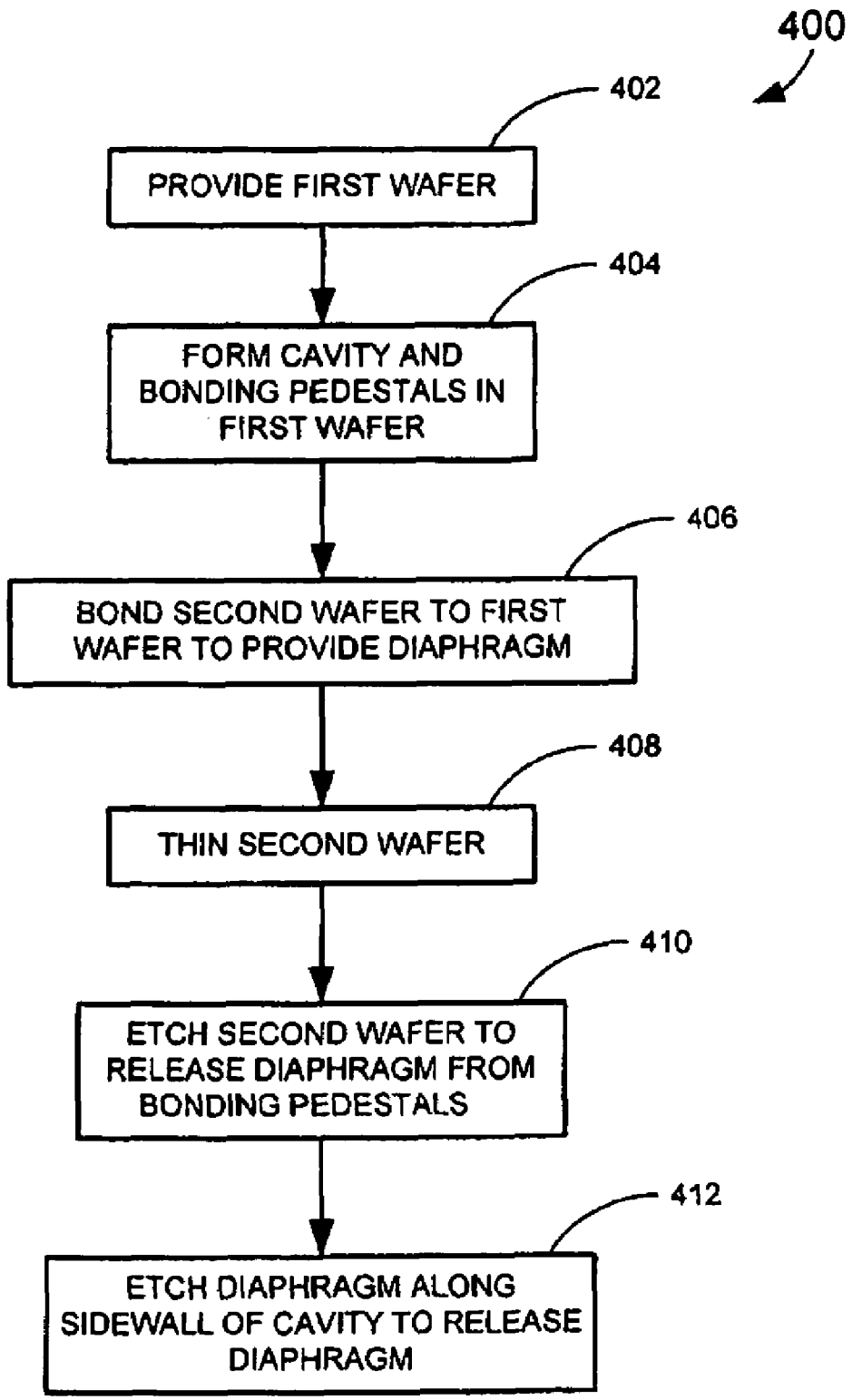
FIG. 4 is a flow chart of a process for manufacturing a MEM device, according to another embodiment of the present invention.

Turning to FIG. 4, a process 400 for manufacturing a MEM device using two wafers and no bonding layer, is depicted. In step 402, a first wafer, e.g., a silicon or glass handle wafer, is provided. Next, in step 404, a portion of the first wafer is removed to provide a cavity including support pedestals. Next, in step 406, a second wafer, e.g., an active silicon wafer is bonded to the first wafer to provide a diaphragm. Then, in step 408, the second wafer is thinned. Alternatively, step 408 may be deleted if the second wafer is already a desired thickness. Next, in step 410, the second wafer is etched to release the diaphragm from the support pedestals. As noted above, in the event that the pedestals are recessed, step 410 may be deleted. Finally, in step 412, if desired, the second wafer is etched to release at least a portion of the diaphragm adjacent a sidewall of the cavity. Alternatively, steps 410 and 412 may be performed in a single step. That is, the diaphragm may be released from the support pedestals and the trenches may be etched to release the diaphragm in a single step.

Accordingly, techniques for manufacturing a micro-electro-mechanical (MEM) device have been described herein, which are compatible with most complementary metal-oxide semiconductor (CMOS) processes.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for manufacturing a micro-electro-mechanical (MEM) device, comprising the steps of:
    providing a first wafer;
    removing a portion of the first wafer to provide a cavity including a plurality of spaced support pedestals within the cavity;
    bonding a second wafer to at least a portion of the first wafer, wherein a portion of the second wafer provides a diaphragm over the cavity, and wherein the support pedestals support the diaphragm during processing;
    etching the second wafer to release the diaphragm from the support pedestals; and
    etching at least a portion of the diaphragm adjacent a sidewall of the cavity to allow the diaphragm to move and to provide the (MEM) device that is compatible with a complementary metal-oxide semiconductor (CMOS) process wherein the support pedestals are spaced in a regular pattern such that the cavity is provided without creating stress limit at temperature.

2. The method of claim 1, wherein the first wafer is a handle wafer and the second wafer is an active wafer, and wherein the handle and active wafers are silicon wafers.

3. The method of claim 2, further comprising the step of:
thinning the active wafer to provide a desired thickness for the diaphragm.

4. The method of claim 1, wherein the support pedestals are not bonded to the second wafer.

5. The method of claim 1, wherein the first wafer is an active wafer and the second wafer is a handle wafer, and wherein the handle and active wafers are silicon wafers.

6. The method of claim 1, wherein the support pedestals support the diaphragm during processing to prevent plastic deformation of the diaphragm.

7. The method of claim 1, wherein the support pedestals remain within the cavity.

8. A method for manufacturing a micro-electro-mechanical (MEM) device, comprising the steps of:
providing a first wafer;
forming a bonding layer on a first surface of the first wafer;
removing a portion of the bonding layer to provide a cavity including a plurality of spaced support pedestals within the cavity, wherein the spaced support pedestals are recessed;
bonding a second wafer to at least a portion of the bonding layer, wherein a portion of the second wafer provides a diaphragm over the cavity, and wherein the support pedestals support the diaphragm during processing; and
etching at least a portion of the diaphragm adjacent a sidewall of the cavity to allow the diaphragm to move, wherein the support pedestals remain in the cavity, thereby providing the (MEM) device that is compatible with a complementary metal-oxide semiconductor (CMOS) process wherein the support pedestals are spaced in a regular pattern such that the cavity is provided without creating stress limit at temperature.

9. The method of claim 8, wherein the first wafer is a handle wafer and the second wafer is an active wafer, and wherein the handle and active wafers are silicon wafers.

10. The method of claim 8, wherein the support pedestals are not bonded to the second wafer.

11. The method of claim 8, wherein the bonding layer is made of silicon, an oxide or a nitride.

12. The method of claim 8, wherein the support pedestals support the diaphragm during processing to prevent plastic deformation of the diaphragm.

13. A method for manufacturing a micro-electro-mechanical (MEM) device, comprising the steps of:
providing a handle wafer;
forming a bonding layer on a first surface of the handle wafer;
removing a portion of the bonding layer to provide a cavity including a plurality of
spaced support pedestals within the cavity;
bonding an active wafer to at least a portion of the bonding layer, wherein a portion of the active wafer provides a diaphragm over the cavity, and wherein the support pedestals support the diaphragm;
etching the active wafer to release the diaphragm from the support pedestals, wherein the support pedestals remain within the cavity; and
etching at least a portion of the diaphragm adjacent a sidewall of the cavity to allow the diaphragm to move and to provide the (MEM) device that is compatible with a complementary metal-oxide semiconductor (CMOS) process wherein the support pedestals are spaced in a regular pattern such that the cavity is provided without creating stress limit at temperature.

14. The method of claim 13, wherein the handle and active wafers are silicon wafers.

15. The method of claim 13, wherein the bonding layer is made of silicon, an oxide or a nitride.

16. The method of claim 13, wherein the support pedestals support the diaphragm during processing to prevent plastic deformation of the diaphragm.

17. The method of claim 13, further comprising the step of:
thinning the active wafer to provide a desired thickness for the diaphragm.

* * * * *